(12) United States Patent
Ishida

(10) Patent No.: US 11,538,669 B2
(45) Date of Patent: Dec. 27, 2022

(54) PLASMA PROCESSING APPARATUS

(71) Applicant: TOKYO ELECTRON LIMITED, Tokyo (JP)

(72) Inventor: Toshifumi Ishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 163 days.

(21) Appl. No.: 17/155,927

(22) Filed: Jan. 22, 2021

(65) Prior Publication Data

US 2021/0233749 A1 Jul. 29, 2021

(30) Foreign Application Priority Data

Jan. 24, 2020 (JP) .............................. JP2020-010136

(51) Int. Cl.
*H01J 37/32* (2006.01)

(52) U.S. Cl.
CPC .. *H01J 37/32642* (2013.01); *H01J 37/32715* (2013.01); *H01J 37/32834* (2013.01); *H01J 2237/334* (2013.01)

(58) Field of Classification Search
CPC ........... H01J 37/32568; H01J 37/32642; H01J 37/32715; H01J 37/32834; H01J 37/32357
See application file for complete search history.

(56) References Cited

U.S. PATENT DOCUMENTS

| | | | | |
|---|---|---|---|---|
| 7,589,950 B2* | 9/2009 | Parkhe | ................ | H01L 21/6831 279/128 |
| 11,251,028 B2* | 2/2022 | Tsai | .................. | H01L 21/67028 |
| 2005/0219786 A1* | 10/2005 | Brown | ................ | H01L 21/6831 361/234 |
| 2010/0039747 A1* | 2/2010 | Sansoni | ............ | H01L 21/67103 361/234 |
| 2012/0103793 A1* | 5/2012 | Fujii | ................... | H01J 37/3447 204/192.1 |

FOREIGN PATENT DOCUMENTS

JP 2018-160666 A 10/2018

* cited by examiner

*Primary Examiner* — Tung X Le
(74) *Attorney, Agent, or Firm* — Weihrouch IP

(57) ABSTRACT

An apparatus for a plasma processing includes an annular member, a support unit, a chamber and a pressure control unit. The annular member has a groove or a protrusion circumferentially formed on a bottom surface thereof, the groove or the protrusion having a first thread circumferentially formed on a side surface. The support unit has a protrusion or a groove circumferentially formed on a placing surface on which the annular member is placed such that the groove or the protrusion of the annular member is fitted with the protrusion or the groove of the support unit, the protrusion or the groove of the support unit having a second thread circumferentially formed on a side surface thereof. The chamber has therein the support unit. Further, the pressure control unit controls a pressure in the chamber such that a driving force for circumferentially rotating the annular member is obtained.

20 Claims, 8 Drawing Sheets

PLASMA PROCESSING APPARATUS

CROSS-REFERENCE TO RELATED APPLICATIONS

This application claims priority to Japanese Patent Application No. 2020-010136, filed on Jan. 24, 2020, the entire contents of which are incorporated herein by reference.

TECHNICAL FIELD

The present disclosure relates to a plasma processing apparatus.

BACKGROUND

Japanese Patent Application Publication. No. 2016-160666 discloses a technique in which a vertically movable pusher pin is provided at a stage on which a focus ring is placed, and the focus ring is raised in response to the consumption of the focus ring.

SUMMARY

The present disclosure provides a technique for vertically moving an annular member without providing a mechanical elevating mechanism.

In accordance with an aspect of the present disclosure, there is provided an apparatus for a plasma processing including: at least one annular member, each having at least one groove or at least one protrusion formed along circumferential direction on a bottom surface of the annular member, the groove or the protrusion having a first thread formed on a side surface thereof along the circumferential direction; a support unit having at least one protrusion or at least one groove formed along the circumferential direction on a placing surface on which the annular member is placed such that the groove or the protrusion of the annular member is fitted with the protrusion or the groove of the support unit, the protrusion or the groove of the support unit having a second thread formed on a side surface thereof along the circumferential direction; a chamber in which the support unit is disposed; and a pressure control unit configured to control a pressure in the chamber such that a driving force for rotating the annular member in the circumferential direction is obtained.

BRIEF DESCRIPTION OF THE DRAWINGS

The objects and features of the present disclosure will become apparent the following description of embodiments, given conjunction with the accompanying drawings, in which.

DETAILED DESCRIPTION

Hereinafter, embodiments of a plasma processing apparatus of the present disclosure will be described in detail with reference to the accompanying drawings. The following embodiments are not intended to limit the plasma processing apparatus of the present disclosure.

For example, a plasma processing apparatus for performing etching on a substrate such as a semiconductor wafer (hereinafter, referred to as "wafer") using plasma is known. In the plasma processing apparatus, a focus ring is disposed around the wafer. Further, in the plasma processing apparatus, a cover ring may be disposed around the focus ring. In the plasma processing apparatus, since an annular member such as the focus ring or the cover ring is disposed around the wafer, a plasma state around the wafer becomes uniform, which makes it possible to obtain the uniformity of etching characteristics of the entire surface of the wafer. However, the annular member such as the focus ring or the cover ring becomes thinner as it is consumed by etching. Thus, in the plasma processing apparatus, the etching characteristics of an outer periphery of the wafer may deteriorate as the annular member is consumed.

Therefore, Japanese Patent Application. Publication No. 2018-160666 discloses a technique in which a vertically movable pusher pin is provided at a stage on which a focus ring is placed, and the focus ring is raised by the pusher pin in response to the consumption of the focus ring.

However, the configuration of the plasma processing apparatus becomes complicated in the case of providing a mechanical elevating mechanism such as the pusher pin to raise and lower the annular member.

Therefore, it is desirable to provide a technique for vertically moving an annular member without providing a mechanical elevating mechanism.

(Configuration of Plasma Processing Apparatus)

Figure 1:
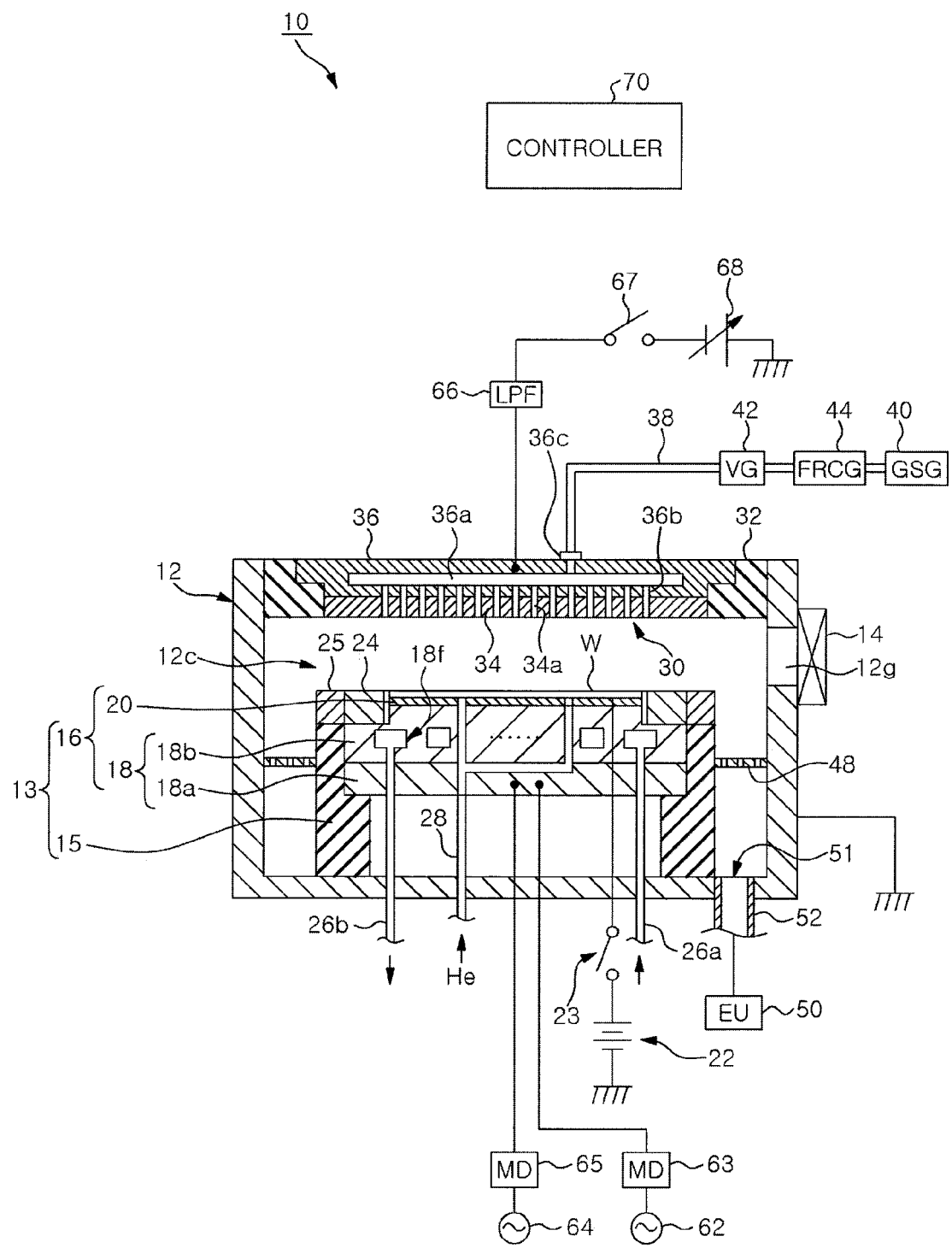
FIG. 1 schematically shows an example of a cross section of a plasma processing apparatus according to an embodiment.

An example of a plasma processing apparatus according to an embodiment will be described. In the present embodiment, a case where the plasma processing apparatus performs plasma etching as plasma processing on a substrate will be described as an example. A wafer will be described as an example of a substrate. FIG. 1 schematically shows an example of a cross section of a plasma processing apparatus according to an embodiment. The plasma processing apparatus 10 shown in FIG. 1 is a capacitively coupled plasma processing apparatus.

The plasma processing apparatus 10 includes an airtight chamber 12. The chamber 12 has a substantially cylindrical shape and is made of, for example, aluminum. The chamber 12 has an inner space serving as a processing space 12c for performing plasma processing. A plasma resistant film is formed on an inner wall surface of the chamber 12. The plasma resistant film may be an alumite film or a film made of yttrium oxide. The chamber 12 is frame-grounded. An opening 12g is formed on a sidewall of the chamber 12. The wafer W passes through the opening 12g when the wafer W is loaded into the processing space 12c from the outside of the chamber 12 or when the wafer W is unloaded from the processing space 12c to the outside of the chamber 12. A gate valve 14 for opening and closing the opening 12g is provided on the sidewall of the chamber 12.

A support 13 for supporting the wafer W is disposed near the center of the inner space of the chamber 12. The support 13 includes a support member 15 and a stage 16. The support member 15 has a substantially cylindrical shape and is disposed on the bottom of the chamber 12. The support member 15 is made of, for example, an insulating material. In the chamber 12, the support member 15 extends upward from the bottom of the chamber 12. The stage 16 is disposed in the processing space 12c. The stage 16 is supported by the support member 15.

The stage 16 is configured to hold the wafer W placed thereon. The stage 16 includes a lower electrode 18 and an electrostatic chuck 20. The lower electrode 18 has a first plate 18a and a second plate 18b. The first plate 18a and the second plate 18b are made of a metal such as aluminum. Each of the first plate 18a and the second plate 18b has a substantially disc shape. The second plate 18b is disposed on the first plate 18a and is electrically connected to the first plate 18a.

The electrostatic chuck 20 is disposed on the second plate 18b. The electrostatic chuck 20 has an insulating layer and a film-shaped electrode interposed in the insulating layer. A DC power supply 22 is electrically connected to the electrode of the electrostatic chuck 20 through a switch 23. A DC voltage is applied from the DC power supply 22 to the electrode of the electrostatic chuck 20. When the DC voltage is applied to the electrode of the electrostatic chuck 20, the electrostatic chuck 20 generates an electrostatic attractive force to attract and hold the wafer W on the electrostatic chuck 20. Further, a heater may be disposed in the electrostatic chuck 20, and a heater power supply disposed outside the chamber 12 may connected to the heater.

In the plasma process rig apparatus 10, an annular member is disposed around the wafer W. In the present embodiment, the plasma processing apparatus 10 includes a focus ring 24 and a cover ring 25 as annular members. The focus ring 24 is disposed on a peripheral portion of the second plate 18b. The focus ring 24 is a substantially annular plate. The focus ring 24 is disposed to surround the edge of the wafer W and the electrostatic chuck 20. The focus ring 24 is provided to improve the uniformity of etching. The focus ring 24 may be made of a material such as silicon (Si), silicon carbide (SiC), or quartz. The cover ring 25 for protecting a side surface of the focus ring 24 is disposed around the focus ring 24. The cover ring 25 is a substantially annular plate having an inner diameter greater than an outer diameter of the focus ring 24. The cover ring 25 is disposed to surround the focus ring 24. The cover ring 25 may be made of a material such as quartz.

A flow channel 18f is formed in the second plate 16b. A temperature control fluid is supplied from a chiller unit disposed outside the chamber 12 to the flow channel 18f through a line 26a. The temperature control fluid supplied to the flow channel 18f is returned to the chiller unit through a line 26b. In other words, the temperature control fluid circulates between the flow channel 18f and the chiller unit. By controlling a temperature of the temperature control fluid, a temperature of the stage 16 (or the electrostatic chuck 20) and a temperature of the wafer W are adjusted. The temperature control fluid may be, e.g., Garden (Registered Trademark).

The plasma processing apparatus 10 further includes a gas supply line 28. The gas supply line 28 is provided to supply a heat transfer gas, e.g., He gas, from a heat transfer gas supply mechanism to a gap between an upper surface of the electrostatic chuck 20 and a back surface of the wafer W.

The plasma processing apparatus 10 further includes a shower head 30. The shower head 30 is disposed above the stage 16. The shower head 30 is supported at an upper portion of the chamber 12 through an insulating member 32. The shower head 30 may include an electrode plate 34 and a holder 36. A bottom surface of the electrode plate 34 faces the processing space 12c. The electrode plate 34 has a plurality of gas injection holes 34a. The electrode plate 34 may be made of a material such as silicon or silicon oxide.

The holder 36 for detachably supporting the electrode plate 34 is made of a conductive material such as aluminum. A gas diffusion space 36a is formed in the holder 36. A plurality gas holes 36b communicating with the gas injection holes 34a extends downward from the gas diffusion space 36a. The holder 36 has a gas inlet port 36c for guiding a gas to the gas diffusion space 36a. A gas supply line 38 is connected to the gas inlet port 36c.

A gas source group (GSG) 40 is connected to the gas supply line 38 through a valve group (VG) 42 and a flow rate controller group (FRCG) 44. The gas source group 40 includes various gas sources used for plasma etching. The valve group 42 includes a plurality of valves. The flow rate controller group 44 includes a plurality of flow rate controllers such as mass flow controllers or pressure control type flow rate controllers. The gas sources of the gas source group 40 are connected to the gas supply line 38 through the corresponding valves of the valve group 42 and the corresponding flow rate controllers of the flow rate controller group 44. The gas source group 40 is provided to supply various gases for plasma etching to the gas diffusion space 36a of the holder 36 through the gas supply line 38. The gas supplied to the gas diffusion space 36a is diffused and supplied in a shower-like manner into the chamber 12 through the gas injection holes 34a and the gas holes 36b.

A first radio frequency (RF) power supply 62 is electrically coupled to the lower electrode 18 through a matching device (MD) 63. A second RF power supply 64 is electrically coupled to the lower electrode 18 through a matching device (MD) 65. The first RF power supply 62 generates a RF power for plasma generation. The first RF power supply 62 supplies an RF power of a predetermined frequency ranging from 27 MHz to 100 MHz, for example, 40 MHz, to the lower electrode 18 of the stage 16 during plasma processing. The second RF power supply 64 generates a RF power for ion attraction (for bias). The second RF power supply 64 supplies an RF power of a predetermined frequency ranging from 400 kHz to 13.56 MHz, for example, 3 MHz, which is lower than that of the first RF power supply 62, to the lower electrode 18 of the stage 16 during plasma processing. As described above, the stage 16 is configured such that two RF powers having different frequencies can be supplied from the first RF power supply 62 and the second RF power supply 64 to the stage 16. The shower head 30 and the stage 16 function as a pair of electrodes (upper electrode and lower electrode).

A variable DC power supply 68 is connected to the holder 36 of the shower head 30 through a low pass filter (LPF) 66. The variable DC power supply 68 is on-off controlled by an on/off switch 67. A current and a voltage of the variable DC power supply 68 and an on/off operation of the on/off switch 67 are controlled by a controller 70 to be described later. When the RD powers are supplied to the stage 16 from the first RF power supply 62 and the second RF power supply 64 to generate plasma in the processing space, the on/off switch 67 is turned on by the controller 70 and a predetermined DC voltage is applied to the holder 36, if necessary.

At the bottom of the chamber 12, an exhaust port 51 is disposed at a side portion of the stage 13. An exhaust unit (EU) 50 is connected to the exhaust port 51 through an exhaust line 52. The exhaust unit 50 includes a pressure controller such as a pressure control valve, and a vacuum pump such as a turbo molecular pump. The exhaust unit 50 can reduce a pressure in the chamber to a desired pressure level by exhausting the chamber 12 through the exhaust port 51 and the exhaust line 52.

In the chamber 12, a baffle plate 48 is disposed on an upstream side compared to the exhaust port 51 in a gas exhaust flow toward the exhaust port 51. The baffle plate 48 is disposed between the support 13 and the inner side surface of the chamber 12 to surround the support 13. The baffle plate 48 is, for example, a plate-shaped member, and can be formed by coating ceramic such as $Y_2O_3$ on a surface of an aluminum base. The baffle plate 48 is a member having multiple slits, a mesh member, or a member having multiple punching holes, so that a gas can pass therethrough. The baffle plate 48 divides the inner space of the chamber 12 into the processing space 12c for performing plasma processing on the wafer W and an exhaust space connected to an exhaust system for exhausting the chamber 12, such as the exhaust line 52, the exhaust unit 50, and the like.

The plasma processing apparatus 10 further includes the controller 70. The controller 70 is, e.g., a computer including a processor, a storage unit, an input device, a display device, and the like. The controller 70 is configured to control the individual components of the plasma processing apparatus 10. The controller 70 allows an operator to input a command using the input device to manage the plasma processing apparatus 10. Further, the controller 70 allows the display device to visualize and display an operation status of the plasma processing apparatus 10. Further, the storage unit of the controller 70 stores recipe data and control programs for controlling various processes performed in the plasma processing apparatus 10 by the processor. The processor of the controller 70 executes the control program and controls the individual components of the plasma processing apparatus 10 based on the recipe data, so that desired processing is performed by the plasma processing apparatus 10.

Here, as described above, the annular members such as the focus ring 24 and the cover ring 25 become thinner as they are consumed by etching. In the plasma processing apparatus 10, the etching characteristics of the outer periphery of the wafer W deteriorate as the annular members are consumed.

Figure 2:
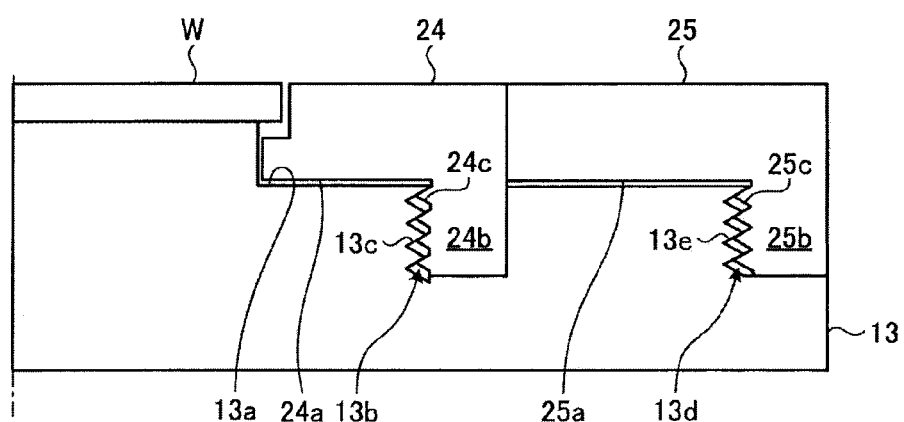
FIG. 2 shows an example of a structure of each annular member according to the embodiment.

Therefore, in the plasma processing apparatus 10, each of the annular members has the following structure. FIG. 2 shows an example of a structure of each annular member according to the embodiment. In FIG. 2, the focus ring 24 and the cover ring 25 are shown as the annular members. Each of the focus ring 24 and the cover ring 25 is formed in an annular shape. The focus ring 24 is placed on the support 13 to surround the periphery of the wafer W. The cover ring 25 is placed on the support 13 to surround the focus ring 24.

The focus ring 24 has a protrusion 24b formed along a circumferential direction on an annular bottom surface 24a facing downward when the focus ring 24 is placed on the support 13. In FIG. 2, the protrusion 24b is formed at an outer edge of the bottom surface 24a. The protrusion 24b may be formed near the center of the bottom surface 24a or at the inner edge of the bottom surface 24a. A spiral thread 24c is formed on a side surface of the protrusion 24b along the circumferential direction. In FIG. 2, the thread 24c is formed on an inner side surface of the protrusion 24b.

The cover ring 25 has a protrusion 25b formed along the circumferential direction on an annular bottom surface 25a facing downward when the cover ring 25 is placed on the support 13. In FIG. 2, the protrusion 25b is formed at the outer edge of the bottom surface 25a. The protrusion 25b may be formed near the center of the bottom surface 25a or at an inner edge of the bottom surface 25a. A spiral thread 25c is formed on a side surface of the protrusion 25b along the circumferential direction. In FIG. 2, the thread 25c is formed on an inner side surface of the protrusion 25b.

The focus ring 24 and the cover ring 25 are placed on a placing surface 13a of the support 13. The support 13 has a groove 13b formed along the circumferential direction at a position of the placing surface 13a below the focus ring 24. A spiral thread 13c is formed on a side surface of the groove 13b along the circumferential direction. In FIG. 2, the thread 13c is formed on an inner side surface of the groove 13b.

Further, the support 13 has a groove 13d formed along the circumferential direction at a position of the placing surface 13a below the cover ring 25. A spiral thread 13e is formed on a site surface of the groove 13d along the circumferential direction. In FIG. 2, the thread 13e is formed on an inner side surface of the groove 13d.

The focus ring 24 is positioned by fitting the protrusion 24b into the groove 13b of the support 13. For example, the focus ring 24 is rotated in the circumferential direction so that the thread 24c of the protrusion 24b is engaged with the thread 13c of the groove 13b of the support 13. The cover ring 25 is positioned by fitting the protrusion 25b into the groove 13d of the support 13. For example, the cover ring 25 is rotated in the circumferential direction so that the thread 25c of the protrusion 25b is engaged with the thread 13e of the groove 13d of the support 13.

In the plasma processing apparatus 10 shown in FIGS. 1 and 2, the protrusions 24b and 25b are formed on the bottom surfaces 24a and 25a of the focus ring 24 and the cover ring 25, respectively, and the grooves 13b and 13d are formed on the placing surface 13a of the support 13. However, in the plasma processing apparatus 10, grooves, each having a thread on a side surface thereof, may be formed on the bottom surfaces 24a of the focus ring 24 and the bottom surface 25a of the cover ring 25. Further, in the plasma processing apparatus 10, protrusions, each having a thread on a side surface thereof, may be formed on the placing surface 13a of the support 13 to be engaged with the grooves of the focus ring 24 and the cover ring 25.

A small space is formed between the focus ring 24 and the support 13 and between the cover ring 25 and the support 13. When the pressure in the chamber 12 is changed by the exhaust unit 50, a force vertically acts on the focus ring 25 and the cover ring 25 due to a difference between the pressure in the space between the focus ring 24/cover ring 25 and the support 13 and the pressure in the chamber 12. In the plasma processing apparatus 10 of the present embodiment, the pressure in the chamber 12 is controlled by the exhaust unit 50 such that a driving force for rotating the focus ring 24 and the cover ring 25 in the circumferential direction can be obtained.

Figure 3A:
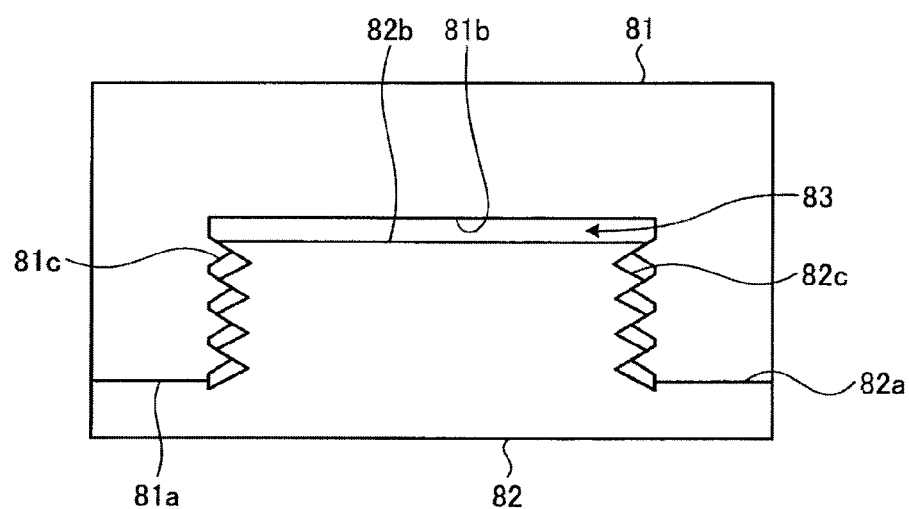
FIGS. 3A to 3C are diagrams for explaining a force applied to each annular member according to the embodiment.
Figure 3B:
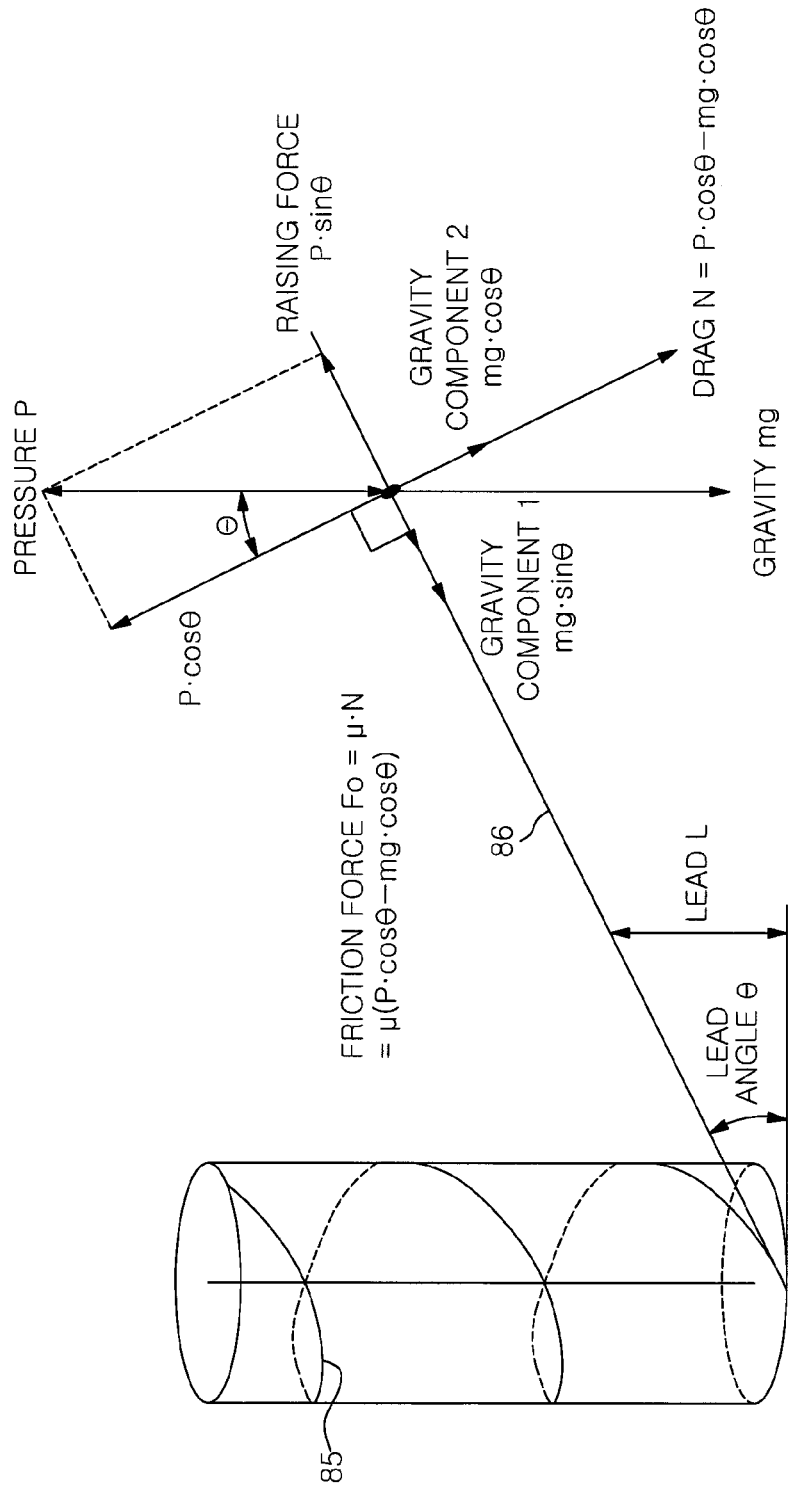

Hereinafter, the force applied to the annular member such as the focus ring 24 or the cover ring 25 will be described. FIGS. 3A and 3B are diagrams for explaining the force applied to each annular member according to the embodiment. FIG. 3A shows a first member 81 and a second member 82. The first member 81 is a simplified version of the annular member such as the focus ring 24, the cover ring 25, or the like. The second member 82 is a simplified version of the support 13.

The first member 81 is formed in an annular shape, and has a recess 81b on a bottom surface 81a thereof. A spiral thread 81c is formed on a side surface of the recess 81b along the circumferential direction. A protrusion 82b is formed on an upper surface 82a of the second member 82 at a position corresponding to the recess 81b of the first member 81. A spiral thread 82c is formed on a side surface of the protrusion 82b along the circumferential direction to be engaged with the thread 81c. The first member 81 is rotated in the circumferential direction so that the thread 81c is engaged into the thread 82c of the second member 82.

FIG. 3S shows a helix 85 indicating the groove trajectory of the thread 81c and the thread 82c. The lead angle of each of the thread 81c and the thread 82c is indicated by θ, and the lead is indicated by L. The lead angle θ is an angle between the helix 85 and the plane perpendicular to the rotation axis of the helix 85. The lead is an axial distance of the helix during one complete turn.

FIG. 3S shows a straight line 86 obtained by linearizing the helix 85. The gravity mg acts downward on the first member 81 shown in FIG. 3A. As shown in FIG. 3B, the gravity mg is divided into a gravity component 1 that is directed along the straight line 86 and a gravity component 2 that is perpendicular to the straight line 86. The gravity component 1 is "mg·sin θ." The gravity component 2 is "mg·cos θ."

As shown in FIG. 3A, there is a space 83 between the first member 81 and the second member 82. In the plasma processing apparatus 10, when the pressure in the chamber 12 is changed by the exhaust unit 50, a force vertically acts on the first member 81 due to the difference between the pressure in the space 83 and the pressure in the chamber 12. For example, when the pressure in the chamber 12 is reduced, an upward force acts on the first member 81. In FIG. 3B, the force generated by the pressure difference is expressed as a pressure P.

The pressure P is divided into a component "P·sin θ" that is directed along the straight line 86 and a component "P·cos θ" that is perpendicular to the straight line 86. The component "P·sin θ" directed along the straight iron 86 is a force that raises the first member 81 along the helix 85.

Further, friction is generated between the first member 81 and the second member 82 when the thread 81c is engaged with the thread 82c. When a drag between the thread 81c and the thread 82c is indicated by N and a friction coefficient is indicated by μ, the friction becomes "N·μ."

From the components of the pressure P and the gravity mg that are perpendicular to the straight line 86, the drag N can be calculated as "N=P·cos θ−mg·cos θ." Therefore, the friction (friction force $F_0$ shown in FIG. 3B) is equal to "μ(P·cos θ−mg·cos θ)."

In order to raise the first member 81, the first member 81 needs to be rotated along the helix 85. As shown in the following equation (1), the first member 81 rotates when the value of the component (P·sin θ) of the pressure P that is directed along the straight line 86 is greater than the value of the sum of the friction and the gravity component 1. The equation (1) is given as follows:

$$P \cdot \sin θ > μ(P \cdot \cos θ − mg \cdot \cos θ) + mg \cdot \sin θ \qquad \text{Eq. (1)}.$$

Further, the equation (1) can be converted to the following equation (2):

$$μ < \sin θ / \cos θ = \tan θ \qquad \text{Eq. (2)}.$$

In other words, the first member 81 can be rotated and vertically moved when the thread 81c and the thread 82c have the lead angle θ that satisfies the equation (2). For example, the member 81 is rotated and raised by reducing the pressure in the chamber 12 such that the force generated by the difference between the pressure in the space 83 and the pressure in the chamber 12 becomes greater than the gravity acting on the first member 81.

Figure 3C:
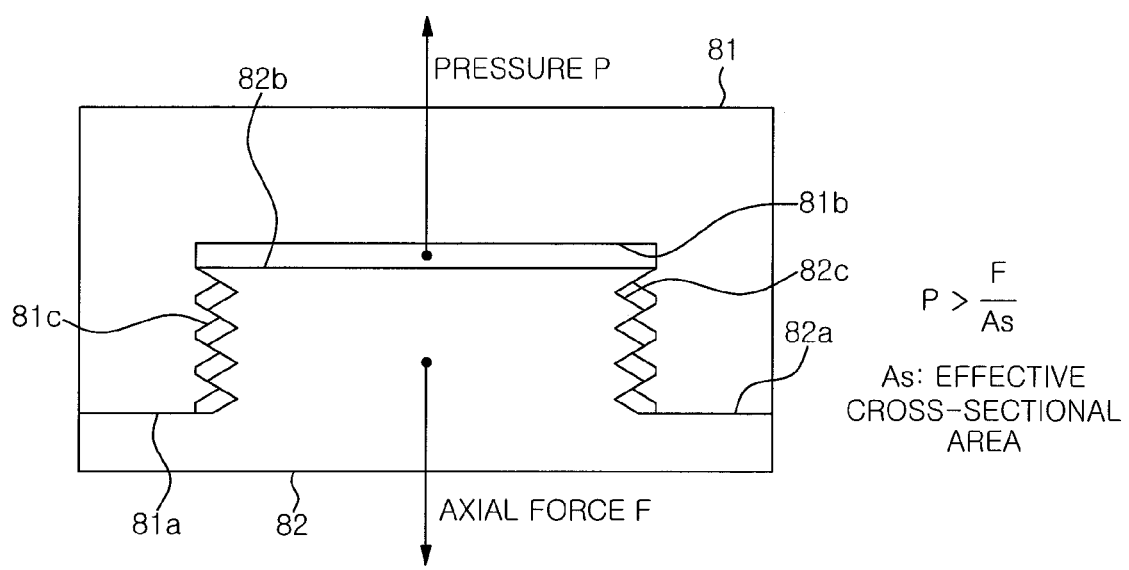

When the thread 81c of the first member 81 and the thread 82c of the second member 82 are tightly engaged, the axial force acting between the first member 81 and the second member 82 may be further considered. FIG. 3C is a diagram for explaining a force acting on the annular member according to the embodiment. The axial force is generated by firmly tightening the first member 81 to the second member 82. A force greater than or equal to the axial force is required to raise the first member 81. When an effective cross-sectional area of the thread 81c and the thread 82c is indicated by As and the axial force is indicated by F, the pressure P generated by the pressure difference needs to satisfy the following equation (3):

$$P > F/As \qquad \text{Eq. (3)}.$$

In the equation (3), the gravity mg acting on the first member 81 is small compared to the axial force and thus is omitted. When the gravity mg acting on the first member 81 is large, the pressure P generated by the pressure difference needs to satisfy the following equation (4):

$$P > F/As − mg \qquad \text{Eq. (4)}.$$

By controlling the pressure in the chamber 12 such that the pressure P that satisfies the equation (3) or (4) is generated, a driving force for rotating the first member the circumferential direction can be obtained.

Meanwhile, it is easier to raise the first member 81 as the friction coefficient μ between the thread 81c and the thread 82c becomes smaller. However, when the friction coefficient becomes smaller, the first member 81 may be lowered due to the gravity acting thereon.

Therefore, in the thread 81c and the thread 82c, two flank surfaces of the grooves thereof may have different friction coefficients. For example, the thread 81c and the thread 82c may be machined such that the friction coefficient of a lower flank surface becomes greater than that of an upper flank surface when the annular member is placed on the support 13.

Figure 4A:
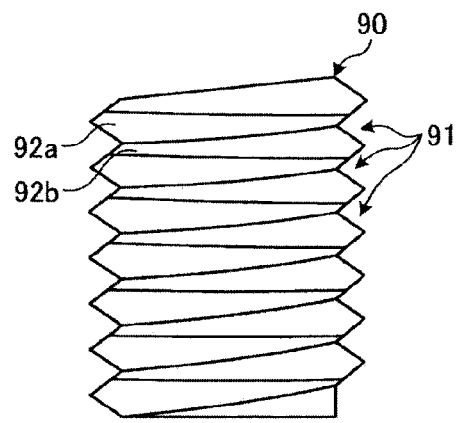
FIG. 4A is a diagram for explaining a machining of a thread.
Figure 4B:
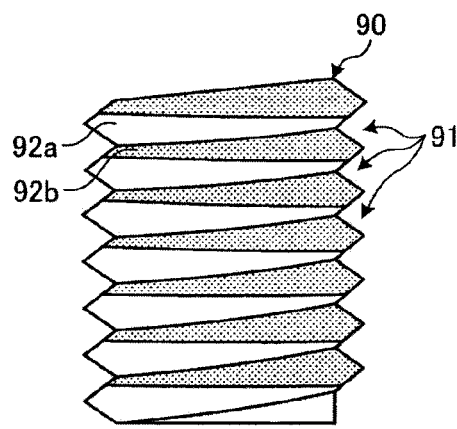
FIGS. 4B and 4C show examples of the machining of the thread according to the embodiment.
Figure 4C:
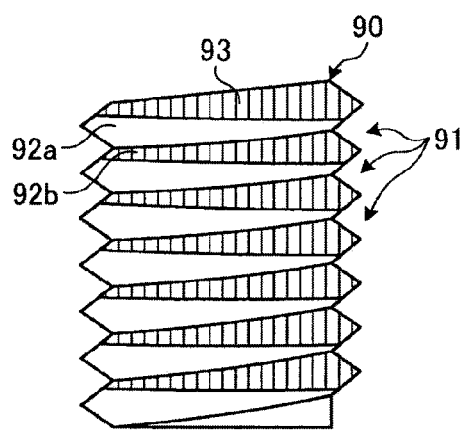

FIG. 4A is a diagram for explaining the machining of the thread. FIG. 4A shows a thread 90 before machining. Each groove 91 of the thread 90 has two flank surfaces 92a and 92b connecting the crest with the root. In FIG. 4A, when the annular member is placed on the support 13, the flank surface 92a is an upper flank surface and the flank surface 92b is a lower flank surface. FIG. 4B shows an example of the machining of the thread 90 according to the embodiment. In FIG. 4B, the flank surface 92a is an upper flank surface and the flank surface 92b is a lower flank surface when the annular member is placed on the support 13, and the surface roughness of the lower flank surface 92b is greater than the surface roughness of the upper flank surface 92a such that the friction coefficient of the lower flank surface 92b is higher than the friction coefficient of the upper flank surface 92a. FIG. 4C shows an example of the machining of the thread 90 according to the embodiment. In FIG. 4C, the flank surface 92a is an upper flank surface and the flank surface 92b is a lower flank surface when the annular member is placed on the support 13, and vertical grooves 93 are formed on the lower flank surface 92b such that the friction coefficient of the lower flank surface 92b is higher than the friction coefficient of the upper flank surface 92a. Accordingly, the first member 81 can be raised stably.

In the plasma processing apparatus 10 shown in FIGS. 1 and 2, the threads 24c and 13c and the threads 25c and 13e are formed at the focus ring 24 and the cover ring 25, respectively, such that the lead angles θ thereof satisfy the equation (2). Further, each of the threads 24c, 13c, 25c, and 13e is processed and machined such that the friction coefficient of the lower flank surface become greater than that of the upper flank surface when the focus ring 24 and the cover ring 25 are placed on the support 13. For example, the machining is performed such that the lower flank surface has a friction coefficient that prevents the first member 81 from being lowered due to a pressure change (pressurization) the chamber 12 when the plasma processing apparatus 10 performs plasma processing on the wafer W. Further, the machining is performed such that the upper flank surface has a friction coefficient that allows the first member 81 to be raised due to a pressure change (decompression) in the chamber 12 when the plasma processing apparatus 10 performs plasma processing on the wafer W.

Further, the pressures P that satisfy the equation (3) and (4) are respectively obtained from the axial force F acting on the focus ring 24 and the cover ring 25. In the plasma processing apparatus 10, the pressure in the chamber 12 is controlled by the exhaust unit 50 such that the higher of the obtained pressures P is generated between the obtained pressures P. Accordingly, in the plasma processing apparatus 10, a driving force for rotating the focus ring 24 and the cover ring 25 in the circumferential direction can be obtained.

In the plasma processing apparatus 10, the lifting amount per instance can be controlled by adjusting the time required for generating the pressure P, the lead angle θ, or the friction coefficient μ. Further, in the plasma processing apparatus 10, the focus ring 24 and the cover ring 25 can be raised by a desired amount by repeatedly generating the pressure P.

Figure 5:
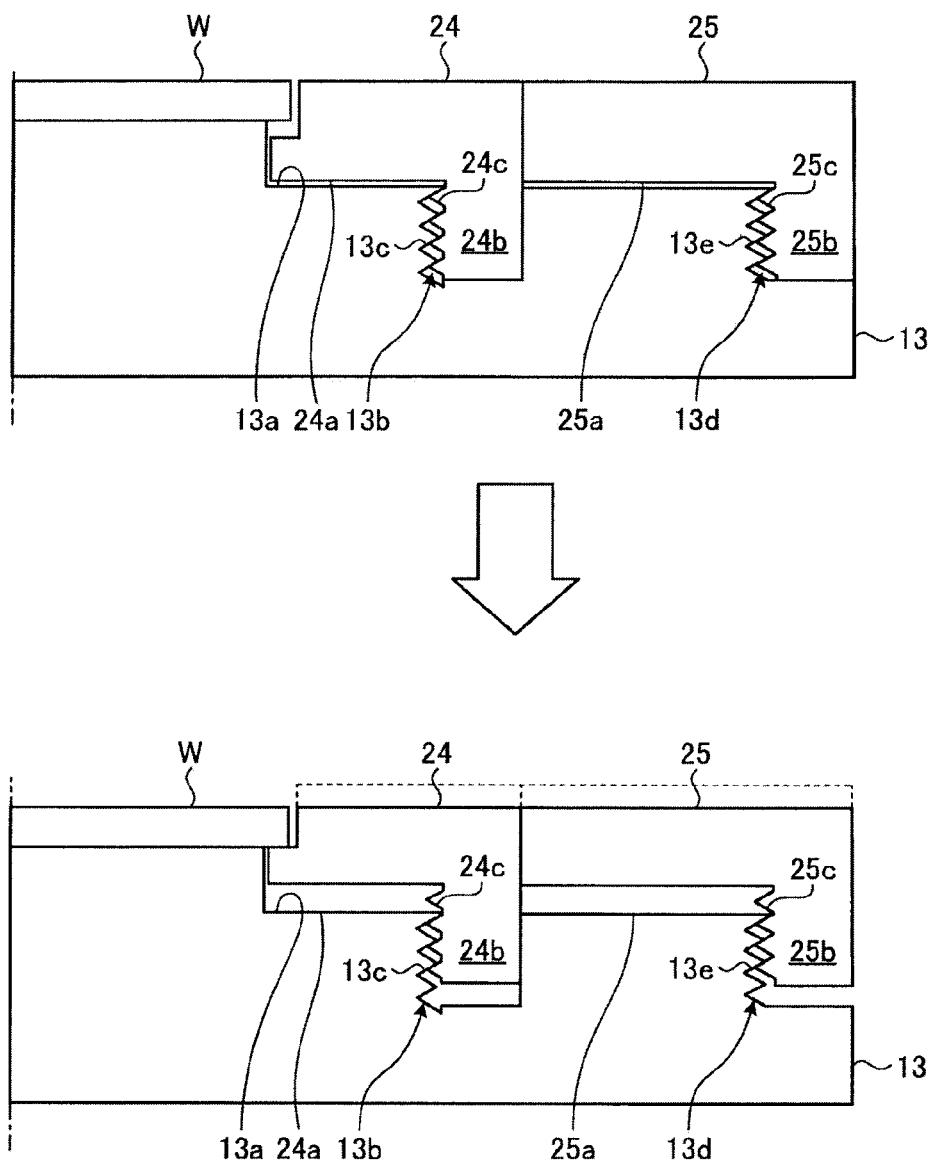
FIG. 5 shows an example of raising each annular member according to the embodiment.

FIG. 5 shows an example of raising each annular member according to the embodiment. The upper diagram of FIG. 5 shows the focus ring 24 and the cover ring 25 that are not raised, and the wafer W. The upper surfaces of the focus ring 24 and the cover ring 25 have the same height as the upper surface of the wafer W. In the plasma processing apparatus 10, the upper surfaces of the focus ring 24 and the covering 25 are consumed as the plasma processing such as etching is repeatedly performed on the wafer W. The lower diagram of FIG. 5 shows the consumed portions of the focus ring 24 and the cover ring 25 that are indicated by dashed lines. In the plasma processing apparatus 10, the pressure in the chamber 12 is controlled through the exhaust unit 50 to generate the pressure P in response to the consumption of the focus ring 24 and the cover ring 25, so that the focus ring 24 and the cover ring 25 are raised based on the consumed amount. Accordingly, in the plasma processing apparatus 10, it is possible to suppress the deterioration of the etching characteristics of the outer periphery of the wafer W due to the consumption of the focus ring 24 and the cover ring 25.

Figure 6:
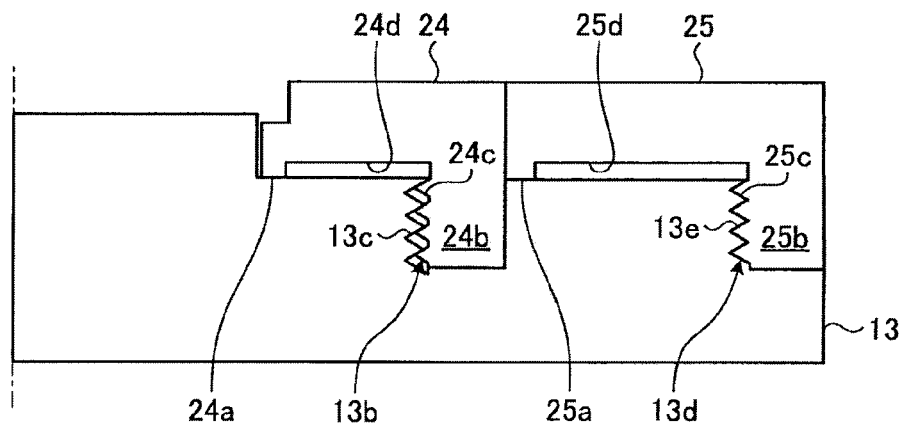
FIG. 6 shows another example of the structure of each annular member according to the embodiment.

In the plasma processing apparatus 10, in order to stably generate the pressure P, a recess may be formed along the circumferential direction on at least one of the bottom surface of the annular member and the placing surface of the support that supports the annular member. FIG. 6 shows another example of the structure of each annular member according to the embodiment. In FIG. 6, the focus ring 24 and the cover ring 25 are illustrated as the annular members. Each of the focus ring 24 and the cover ring 25 are formed in an annular shape. The focus ring 24 has a recess 24d formed on the bottom surface 24a along the circumferential direction. The cover ring 25 has a recess 25d formed on the bottom surface 25a along the circumferential direction. By forming the recesses 24d and 25d, the pressure P can be stably generated due to the difference between the pressures in the spaces in the recesses 24d and 25d and the pressure in the chamber 12.

Figure 7:
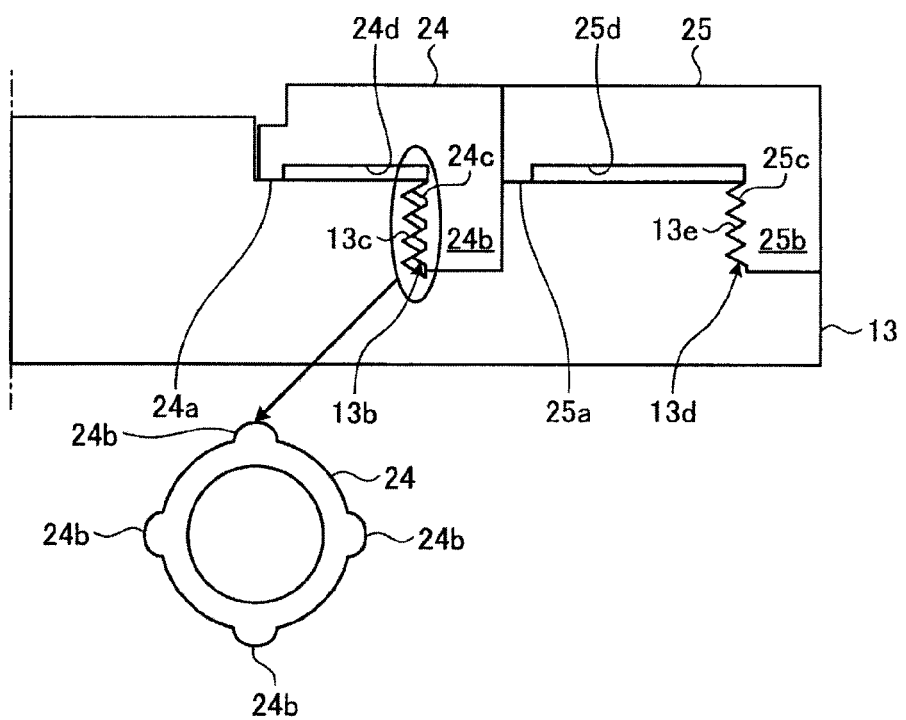
FIG. 7 shows still another example of the structure of each annular member according to the embodiment.

Alternatively, the multiple protrusions 24b may be formed at the focus ring 24 at intervals along the circumferential direction, and the multiple protrusions 25b may be formed at the cover ring 25 at intervals along the circumferential direction. FIG. 7 shows still another example of the structure of each annular member according to the embodiment. In FIG. 7, the focus ring 24 and the cover ring 25 are illustrated as the annular members. An apparent friction coefficient can be controlled by forming, for example, three or four protrusions 24b at the focus ring 24 and three or four protrusions 25b at the cover ring 25. FIG. 7 shows a case where the four protrusions 24b are formed at the focus ring 24.

As described above, the plasma processing apparatus 10 according to the embodiment includes the annular members (the focus ring 24 and the cover ring 25), the support unit (the support 13), the chamber 12, and the pressure control unit (the exhaust unit 50). For each annular member, the groove or the protrusion (the protrusion 24b or 25b) is formed along the circumferential direction on the annular bottom surface (the bottom surfaces 24a or 25a) facing downward when the annular member is placed to surround the periphery of the substrate (the wafer W), and the groove or the protrusion (the protrusion 24b or 25b) has the first thread (the thread grove 24c or 25c) formed on the side surface thereof along the circumferential direction. For the support unit, the protrusion or the groove (the groove 13b or 13d) is formed along the circumferential direction on the placing surface (the placing surface 13a) on which the annular member is placed such that the groove or the protrusion (the protrusion 24b or 25b) of the annular member is fitted with the protrusion or the groove (the groove 13b or 13d) of the support unit, and the protrusion or the groove (the groove 13b or 13d) of the support unit has the second thread (the threads 13c or 13e) formed on the side surface thereof along the circumferential direction.

The support unit is disposed in the chamber 12. The pressure control unit controls the pressure in the chamber such that the driving force for rotating the annular members in the circumferential direction can be obtained. Accordingly, the plasma processing apparatus 10 can raise and lower the annular members without providing a mechanical elevating mechanism.

Further, in the plasma processing apparatus 10, the pressure control unit reduces the pressure in the chamber 12 to raise each annular member with respect to the support unit. Further, the pressure control unit increases the pressure in the chamber 12 from the decompressed state to lower each annular member with respect to the support unit. Therefore, in the plasma processing apparatus 10, the annular member can be simply raised and lowered by changing the pressure in the chamber 12.

Further, in the plasma processing apparatus 10, in order to raise each annular member with respect to the support unit, the pressure control unit reduces the pressure in the chamber 12 such that the force generated by the difference between the pressure in the chamber 12 and the pressure in the space between the annular member and the support unit becomes greater than the axial force acting on the annular member or the sum of the axial force and the gravity. Accordingly, in the plasma processing apparatus 10, it is possible to raise the annular member.

When the lead angle of the first thread of each annular member and the lead angle of the second thread of the support unit are indicated by "θ" and the friction coefficient between the first thread and the second thread is indicated by "μ" the first thread and the second thread are formed such that the lead angles θ thereof satisfy the condition of "tan θ>μ." Accordingly, in the plasma processing apparatus 10, it is possible to raise the annular member.

Further, the first thread of each annular member and the second thread of the support unit are formed such that the friction coefficient of the lower flank surface (the flank surface 92b) becomes greater than that of the upper flank surface (the flank surface 92a) when the annular member is placed on the support unit. Accordingly, in the plasma processing apparatus 10, it is possible to stably raise the annular member.

Further, the recess (the recess 24d or the recess 25d) is formed along the circumferential direction on at least one of the bottom surface of each annular member and the placing surface of the support unit. Accordingly, in the plasma processing apparatus 10, it is possible to stably generate the pressure P by changing the pressure in the chamber 12.

Further, each annular member has the protrusions that are formed at intervals along the circumferential direction on the bottom surface of the annular member. The support unit has the grooves corresponding to the two or more protrusions, and the grooves are formed along the circumferential direction on the placing surface thereof. Accordingly, the friction between the annular members and the support unit is reduced, and the plasma processing apparatus 10 can effectively raise and lower the annular member.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, in the above-described embodiments, the case where the focus ring 24 and the cover ring 25 are the annular members has been described as an example. However, the present disclosure is not limited thereto, and the annular member may be any member as long as it is placed on the periphery of the substrate and needs to be raised and lowered.

Further, in the above-described embodiments, the case where the plasma processing apparatus 10 is a capacitively coupled plasma processing apparatus has been described as an example. However, the present disclosure is not limited thereto, and the plasma processing method according to the embodiment can be employed in any plasma processing apparatus. For example, the plasma processing apparatus 10 may be any type of plasma processing apparatus, such as an inductively coupled plasma processing apparatus or a plasma processing apparatus for exciting a gas with a surface wave such as a microwave.

Further, the above-described plasma processing apparatus 10 may be employed as a plasma processing apparatus for performing etching as plasma processing or a plasma processing apparatus for performing any plasma processing. For example, the plasma processing apparatus 10 may be a single wafer deposition apparatus for performing chemical vapor deposition (CVD), atomic layer deposition (ALD), physical vapor deposition (PVD), or the like, or may be a plasma processing apparatus for performing plasma annealing, plasma implantation, or the like.

Further, in the above-described embodiments, the case where the substrate a semiconductor wafer has been described as an example. However, the present disclosure is not limited thereto, and the substrate may be another substrate such as a glass substrate or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and chances in the form of the embodiments described herein may be made departing from the spirit of the disclosures. The accompanying claims and their equivalents are intended to cover such forms or modifications as would fail within the scope and spirit of the disclosures.

The invention claimed is:

1. An apparatus for a plasma processing comprising:
   at least one annular member, each having at least one groove or at least one protrusion formed along a circumferential direction on a bottom surface of the annular member, the groove or the protrusion having a first thread formed on a side surface thereof along the circumferential direction;
   a support unit having at least one protrusion or at least one groove formed along the circumferential direction on a placing surface on which the annular member is placed such that the groove or the protrusion of the annular member is fitted with the protrusion or the groove of the support unit, the protrusion or the groove of the support unit having a second thread formed on a side surface thereof along the circumferential direction;
   a chamber in which the support unit is disposed; and
   a pressure control unit configured to control a pressure in the chamber such that a driving force rotating the annular member in the circumferential direction is obtained.

2. The apparatus of claim 1, wherein the pressure control unit reduces a pressure in the chamber to raise the annular member with respect to the support unit, and the pressure control unit increases the pressure in the chamber from a decompressed state to lower the annular member with respect to the support unit.

3. The apparatus of claim 2, wherein in order to raise the annular member with respect to the support unit, the pressure control unit reduces the pressure in the chamber such that a force generated by a difference between the pressure in the chamber and a pressure in a space between the annular member and the support unit becomes greater than an axial force acting on the annular member or the sum of the axial force and gravity.

4. The apparatus of claim 3, wherein when a lead angle of the first thread of the annular member and a lead angle of the second thread of the support unit are indicated by θ and a friction coefficient between the first thread and the second thread is indicated by μ, the first thread and the second thread are formed such that the lead angles θ thereof satisfy a condition of tan θ>μ.

5. The apparatus of claim 4, wherein the first thread of the annular member and the second thread of the support unit are formed such that a friction coefficient of a lower flank surface becomes greater than a friction coefficient of an upper flank surface when the annular member is placed on the support unit.

6. The apparatus of claim 5, wherein a recess is formed along the circumferential direction on at least one of the bottom surface of the annular member and the placing surface of the support unit.

7. The apparatus of claim 5, wherein the annular member has two or more protrusions that are formed at intervals along the circumferential direction on the bottom surface thereof, and
    the support unit has two or more grooves corresponding to the two or more protrusions, the grooves being formed along the circumferential direction on the placing surface of the support unit.

8. The apparatus of claim 4, wherein a recess is formed along the circumferential direction on at least one of the bottom surface of the annular member and the placing surface of the support unit.

9. The apparatus of claim 4, wherein the annular member has two or more protrusions that are formed at intervals along the circumferential direction on the bottom surface thereof, and
    the support unit has two or more grooves corresponding to the two or more protrusions, the grooves being formed along the circumferential direction on the placing surface of the support unit.

10. The apparatus of claim 3, wherein the first thread of the annular member and the second thread of the support unit are formed such that a friction coefficient of a lower flank surface becomes greater than a friction coefficient of an upper flank surface when the annular member is placed on the support unit.

11. The apparatus of claim 3, wherein a recess is formed along the circumferential direction on at least one of the bottom surface of the annular member and the placing surface of the support unit.

12. The apparatus of claim 3, wherein the annular member has two or more protrusions that are formed at intervals along the circumferential direction on the bottom surface thereof, and
    the support unit has two or more grooves corresponding to the two or more protrusions, the grooves being formed along the circumferential direction on the placing surface of the support unit.

13. The apparatus of claim 2, wherein when a lead angle of the first thread of the annular member and a lead angle of the second thread of the support unit are indicated by $\theta$ and a friction coefficient between the first thread and the second thread is indicated by $\mu$, the first thread and the second thread are formed such that the lead angles $\theta$ thereof satisfy a condition of $\tan \theta > \mu$.

14. The apparatus of claim 2, wherein the first thread of the annular member and the second thread of the support unit are formed such that a friction coefficient of a lower flank surface becomes greater than a friction coefficient of an upper flank surface when the annular member is placed on the support unit.

15. The apparatus of claim 2, wherein a recess is formed along the circumferential direction on at least one of the bottom surface of the annular member and the placing surface of the support unit.

16. The apparatus of claim 2, wherein the annular member has two or more protrusions that are formed at intervals along the circumferential direction on the bottom surface thereof, and
    the support unit has two or more grooves corresponding to the two or more protrusions, the grooves being formed along the circumferential direction on the placing surface of the support unit.

17. The apparatus of claim 1, wherein when a lead angle of the first thread of the annular member and a lead angle of the second thread of the support unit are indicated by $\theta$ and a friction coefficient between the first thread and the second thread is indicated by $\mu$, the first thread and the second thread are formed such that the lead angles $\theta$ thereof satisfy a condition of $\tan \theta > \mu$.

18. The apparatus of claim 1, wherein the first thread of the annular member and the second thread of the support unit are formed such that a friction coefficient of a lower flank surface becomes greater than a friction coefficient of an upper flank surface when the annular member is placed on the support unit.

19. The apparatus of claim 1, wherein a recess is formed along the circumferential direction on at least one of the bottom surface of the annular member and the placing surface of the support unit.

20. The apparatus of claim 1, wherein the annular member has two or more protrusions that are formed at intervals along the circumferential direction on the bottom surface thereof, and
    the support unit has two or more grooves corresponding to the two or more protrusions, the grooves being formed along the circumferential direction on the placing surface of the support unit.

\* \* \* \* \*